United States Patent [19]

Chan et al.

[11] Patent Number: 5,087,586
[45] Date of Patent: Feb. 11, 1992

[54] PROCESS FOR CREATING FULLY-RECESSED FIELD ISOLATION REGIONS BY OXIDIZING A SELECTIVELY-GROWN EPITAXIAL SILICON LAYER

[75] Inventors: Hiang C. Chan; Pierre C. Fazan, both of Boise, Id.

[73] Assignee: Micron Technology, Inc., Boise, Id.

[21] Appl. No.: 725,139

[22] Filed: Jul. 3, 1991

[51] Int. Cl.$^5$ .............................................. H01L 21/76
[52] U.S. Cl. ....................................... 437/72; 437/89; 437/90
[58] Field of Search .............................. 437/72, 89, 90

[56] References Cited

U.S. PATENT DOCUMENTS 4,758,531 7/1988 Beyer et al. ............................ 437/90
4,843,025 6/1989 Morita .................................... 437/89

FOREIGN PATENT DOCUMENTS 56-87339 7/1981 Japan .................................... 437/89
117422 1/1989 Japan .................................... 437/69

Primary Examiner—Olik Chaudhuri
Assistant Examiner—G. Fourson
Attorney, Agent, or Firm—Angus C. Fox, III

[57] ABSTRACT

A low-stress process for creating field isolation regions on a silicon substrate that are fully recessed with respect to active areas. The field isolation regions, which have no bird's beak transition regions at their edges, are created by oxidizing an epitaxially-grown layer of silicon, the edges of which are isolated from active area silicon by a an oxide-backed silicon nitride spacer. Each nitride spacer is contiguous with a horizontal silicon nitride layer segment that protects an active area from oxidation during thermal field oxidation. A modification of the process, which requires the deposition of an additional silicon dioxide layer and a wet etch to remove spacers created from that additional layer, further reduces stress during thermal oxidation of the epitaxially-grown silicon layer by providing a void around the periphery of the epitaxial layer for expansion during the thermal oxidation thereof.

9 Claims, 10 Drawing Sheets

PROCESS FOR CREATING FULLY-RECESSED FIELD ISOLATION REGIONS BY OXIDIZING A SELECTIVELY-GROWN EPITAXIAL SILICON LAYER

FIELD OF THE INVENTION

This invention relates to semiconductor manufacturing technology and, more specifically, to the growth of field oxide regions on a silicon wafer which serve to isolate devices in an integrated circuit array. The focus of the invention is a low stress technique for creating recessed field oxide regions having no bird's beak transitions at the edges thereof. The process results in an array having planar topography, few stress-induced crystal lattice dislocations, and high device density.

BACKGROUND OF THE INVENTION

Within the realm of semiconductor manufacturing technology, the trend toward ever-increasing device density, accompanied by corresponding decreases in device dimensions seems unlikely to abate in the foreseeable future.

FIG. 1 is a cross-section of the isolation geometry that is created for high-performance MOS arrays utilizing a process known as LOCal Oxidation of Silicon (LOCOS). LOCOS has become the standard device isolation technique, due to the semi-recessed topography of the field oxide 11, low defect density, and the self-aligning nature of the field implant in the n-channel field regions 13. However, with conventional LOCOS technology, precious array area is wasted in the thin-to-thick oxide transition regions known as the "bird's beak" regions 15. The very gradual slope of the bird's beak region not only wastes space, but also hampers subsequent fine-line lithography operations which, for VLSI devices, is best suited to planar surface topography.

The loss of array area in the bird's beak regions is exacerbated by the lateral diffusion of the field implant into the active areas 17. As a result of this phenomenon, the substrate doping is effectively increased in the encroachment region 19 near field edges. Consequently, threshold voltage increases near device edges, and the full device width is unavailable for source-drain current. The usual manifestation of this "narrow channel effect" is an increase in apparent device threshold voltage as the channel width decreases.

If higher packing densities are to be achieved for VLSI devices, it is clear that future approaches to isolation technology must reduce both physical and electrical encroachment and achieve a greater degree of topography planarity. A number of approaches have been proposed as either an alternative or a modification to the LOCOS process.

One of the more basic improvements to LOCOS which results in somewhat more planar surface topography and a reduction in the size of the bird's beak region is the etchback process. The cross-sectional geometry resulting from this process is depicted in FIG. 2. The effectiveness of this technique, however, is limited by two factors—an increase in the effective size of the field implant encroachment region 19 and the degree of remaining surface nonplanarity following the etchback.

Another simple modification to LOCOS, dubbed SILO, results in the cross-sectional profile depicted in FIG. 3. A thin silicon nitride film formed by plasma nitridation or ion implantation is used to either replace or underlay the usual silicon nitride-silicon oxide bilayer used for conventional LOCOS. Although the fabrication process is complicated somewhat by some extra wet cleaning steps, the bird's beak region is reduced in size and lateral field encroachment region is reduced in size because of the reduced temperature cycle needed to grow the field oxide.

Several of the problems associated with LOCOS were ameliorated with a Side Wall Masked Isolation (SWAMI) technique developed at Hewlett Packard Laboratories. The field isolation geometry depicted in FIG. 4 is characteristic of that produced with the SWAMI process. This improvement to LOCOS greatly reduces lateral oxidation and also provides a planar surface topography with steeper oxide-to-silicon isolation boundary 41. However, the SWAMI process adds a great deal of complexity to the fabrication process and can lead to increased defect density.

Another modified LOCOS technique which produces a nearly planar surface topography is the use of potassium hydroxide to etch the field regions prior to thermally growing the oxide. The field isolation geometry depicted in FIG. 5 is representative of that produced with this process. Such a technique results in fully-recessed field oxide regions 11. Unfortunately, lateral oxidation with this technique is greater than with standard LOCOS. Additionally, true planarity is not achieved due to the formation of a "bird's head" 51 during the thermal growth of the field oxide. Bird's head formation is indicative of the existence of stress at the edges of array active areas. Stress can result in crystal lattice locations which increases device defect density.

A new process for creating field isolation regions is needed that provides complete planarity, low defect density, and no bird's beak transition regions at the edge of array active areas.

SUMMARY OF THE INVENTION

The process, which is the focus of this invention, field isolation process that does result in complete planarity of the wafer surface. Hence, the field isolation regions so created are, by definition, fully recessed with respect to the array active areas. Field isolation regions are created by oxidizing an epitaxially-grown layer of silicon, the edges of which are isolated from active area silicon by a wall of oxide-backed silicon nitride. The nitride wall is an extension of a horizontal silicon nitride layer that protects active areas from oxidation during thermal field oxidation.

Briefly, the process, which begins with a wafer consisting of a planar silicon substrate, comprises the following sequence of steps: thermal growth of a pad oxide layer; deposition of a first nitride layer on top of the pad oxide layer; creation of a photoresist mask which covers future active areas; subjecting the wafer to a first anisotropic etch in order to remove portions of the pad oxide layer and first nitride layer in unmasked regions of the wafer, and to create recessed regions of the substrate in those unmasked regions; deposition of a second nitride layer; subjecting the wafer to a second anisotropic etch in order to create nitride spacers on the sidewalls of the recessed substrate regions and clear horizontal portions of the second nitride layer and the pad oxide layer in the recessed regions of the substrate, while leaving the first nitride layer essentially intact on top of future active areas; epitaxially growing silicon within the recessed regions such that the thickness of the epitaxially grown silicon layer is approximately half the thickness of the vertical distance that the substrate was recessed during the first anisotropic etch; thermally oxidizing the expitaxially grown silicon layer until it has achieved a height approximately equal to the unrecessed portions of the substrate; removing remaining silicon nitride; filling the vertical voids left by nitride removal through further thermal oxidation or a chemical vapor deposition step; and, finally, planarizing the wafer.

A modification of the process, which requires the deposition of an additional silicon dioxide layer and a wet etch to remove a spacers created from that additional layer, further reduces stress during thermal oxidation of the epitaxially-grown silicon layer by providing a void around the periphery of the epitaxial layer for expansion during the thermal oxidation thereof.

BRIEF DESCRIPTION OF THE DRAWINGS

FIGS. 6 through 16 depict the process for creating fully-recessed field isolation regions, which is the focus of the present invention.

FIG. 1 is a cross-sectional view depicting the field-isolation geometry characteristic of the conventional LOCOS process;

FIG. 2 is a cross-sectional view depicting the field-isolation geometry characteristic of the LOCOS process followed by an etchback;

FIG. 3 is a cross-sectional view depicting the field-isolation geometry characteristic of the SILO process;

FIG. 4 is a cross-sectional view depicting the field-isolation geometry characteristic of the SWAMI process;

FIG. 5 is a cross-sectional view depicting the field-isolation geometry characteristic of the fully-recessed LOCOS technique;

FIG. 6 is a cross-sectional view of a portion of an in-process semiconductor wafer, showing a silicon substrate on which a first pad oxide layer has been thermally grown and a first silicon nitride layer deposited on top of the pad oxide layer;

FIG. 7 is a cross-sectional view of the wafer portion of FIG. 6 following the creation of a photoresist mask which covers future active areas and exposes future field oxide regions and a subsequent first anisotropic plasma etch;

FIG. 8 is a cross-sectional view of the wafer portion of FIG. 7 following removal of the photoresist mask and a further thermal oxidation step to create a second pad oxide layer;

FIG. 15 is a cross-sectional view of the wafer portion of FIG. 14A or FIG. 14B following a planarization step.

PREFERRED EMBODIMENT OF THE INVENTION

Figure 1:
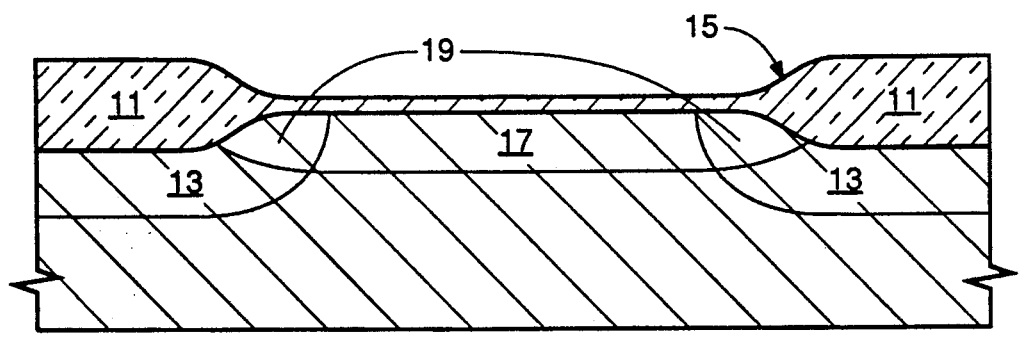
FIGS. 1 through 5 depict field-isolation geometries produced by certain prior-art techniques.
Figure 2:
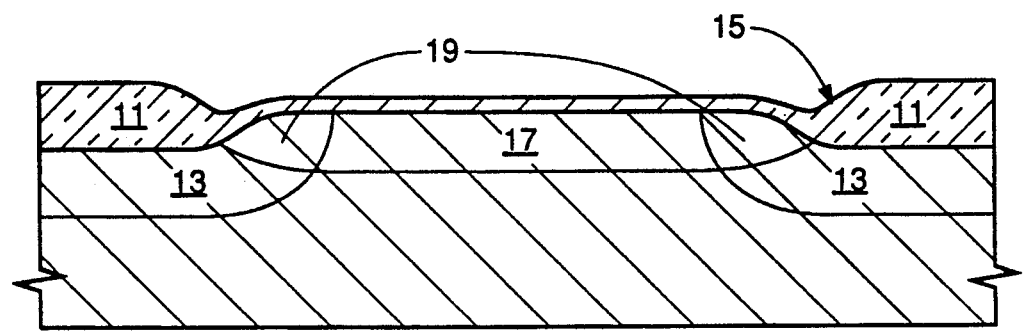
Figure 3:
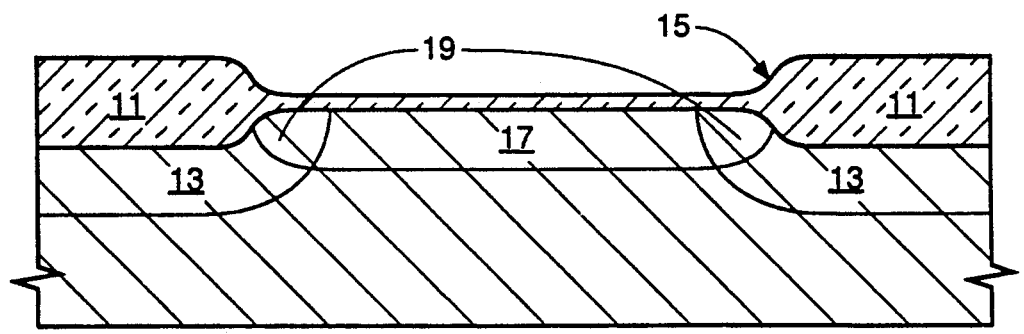
Figure 4:
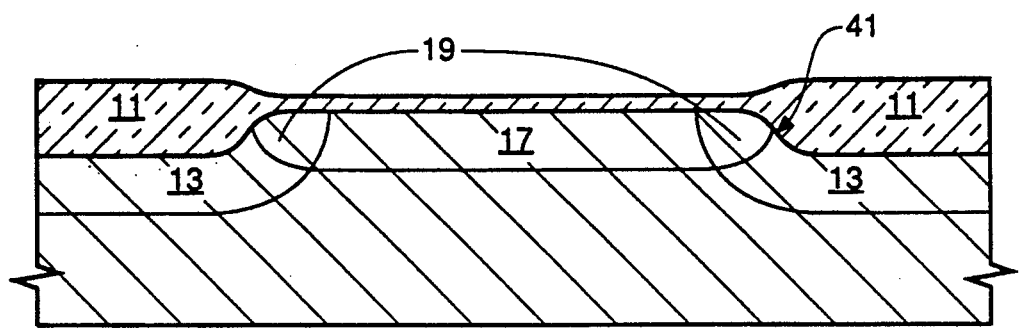
Figure 5:
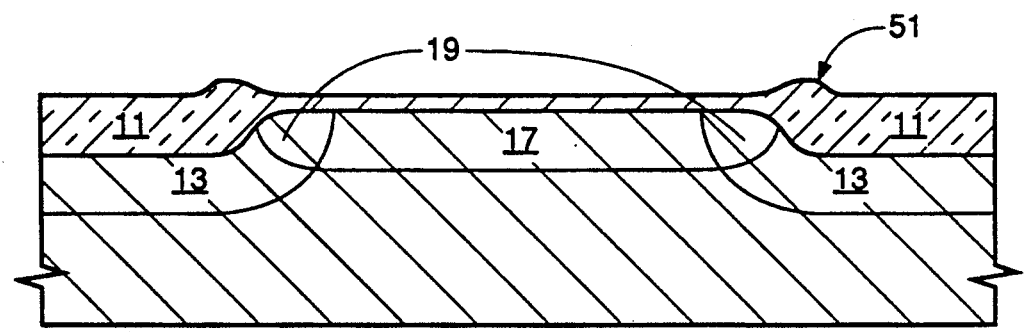
Figure 6:
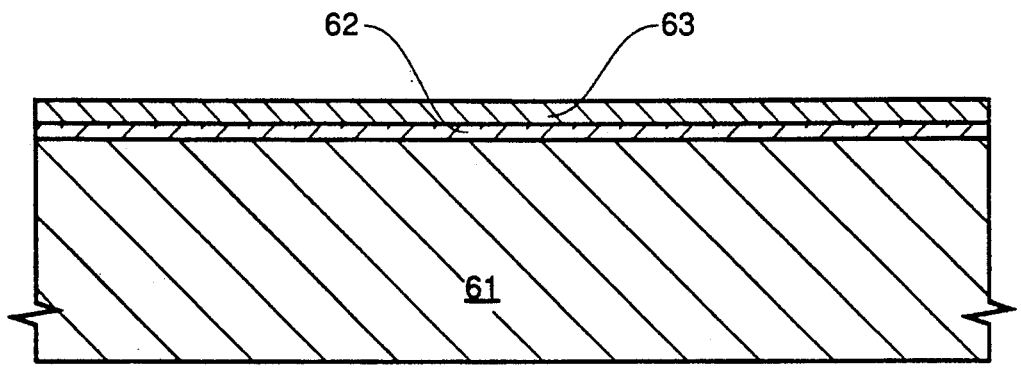

Referring now to FIG. 6, which is a cross-sectional view of a portion of an in-process wafer, a planar silicon substrate 61 has been subjected to thermal oxidation, which has resulted in the growth of a first pad oxide layer 62 having a thickness within a range of 100–500Å. A first silicon nitride layer 63 having a thickness within a range of 700 to 2000 is deposited via low-pressure chemical vapor deposition (LPCVD) on top of the pad oxide layer.

Figure 7:
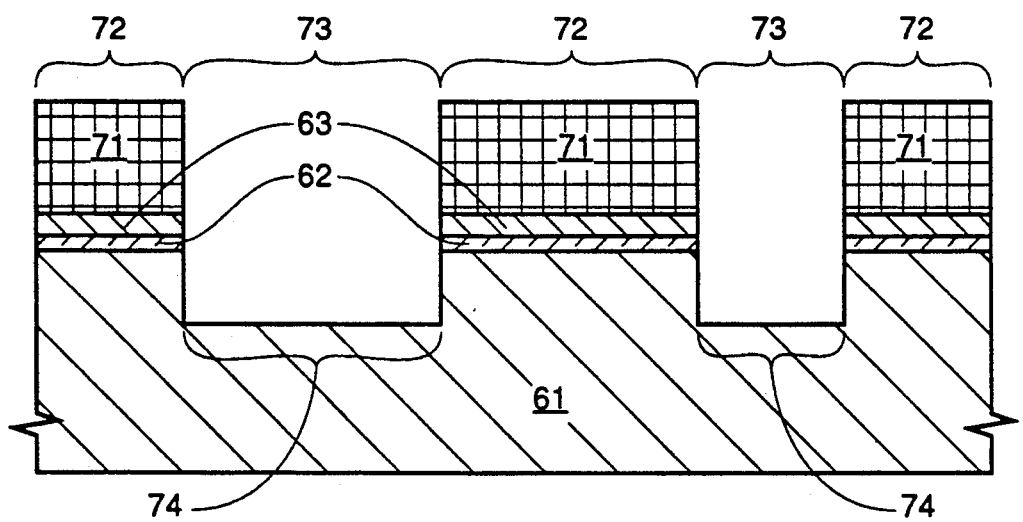

Referring now to FIG. 7, a photoresist mask 71 has been created on top of the first silicon nitride layer 63, which covers future active areas 72 and exposes future field oxide regions 73. A subsequent anisotropic plasma etch of the wafer has removed portions of the first pad oxide layer and first nitride layer in unmasked regions of the wafer, and has created 2000–5000Å-deep recessed regions 74 within the substrate 61 in future field oxide regions 73.

Figure 8:
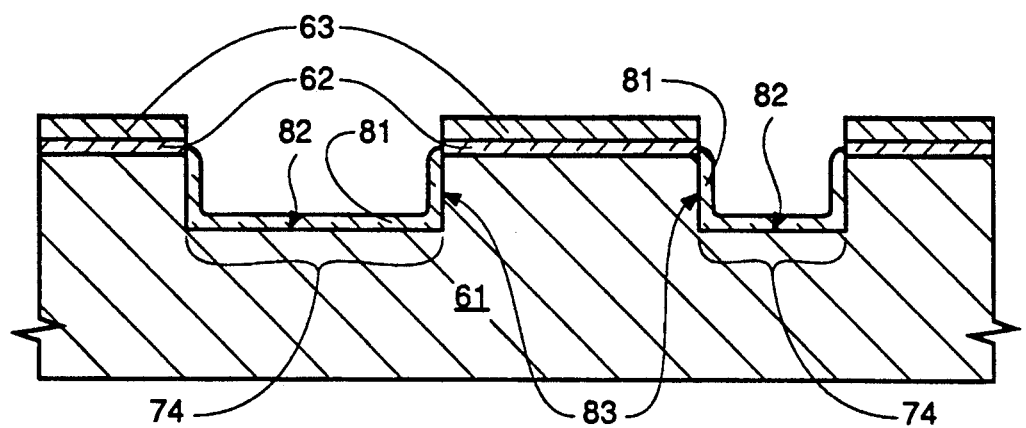

Referring now to FIG. 8, photoresist mask 71 has been removed and the wafer has been subjected to a further thermal oxidation step which has created a second pad oxide layer 81 on floors 82 and sidewalls 83 of the recessed regions 74.

Figure 9A:
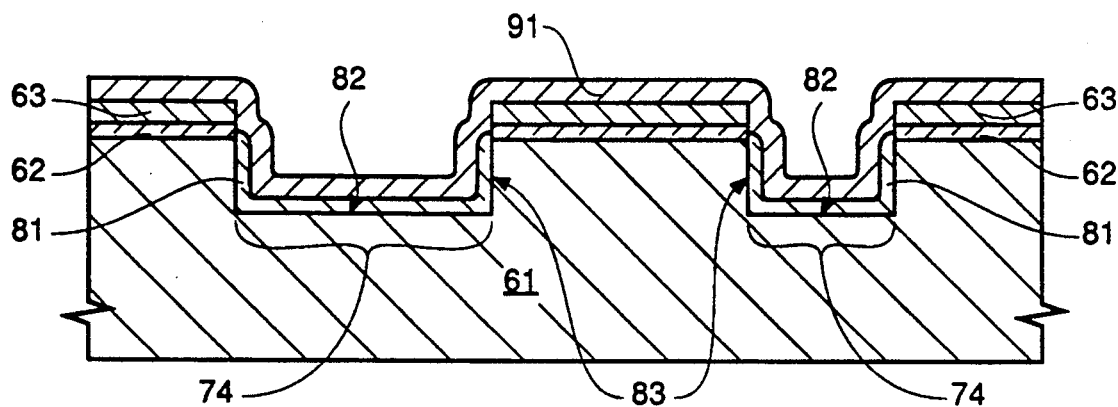
FIG. 9A is a cross-sectional view of the wafer portion of FIG. 8 following the deposition of a second nitride layer.

Referring now to FIG. 9A, a second silicon nitride layer 91 having a thickness within a range of 500–2000Å has been blanket deposited over the wafer surface via LPCVD.

Figure 9B:
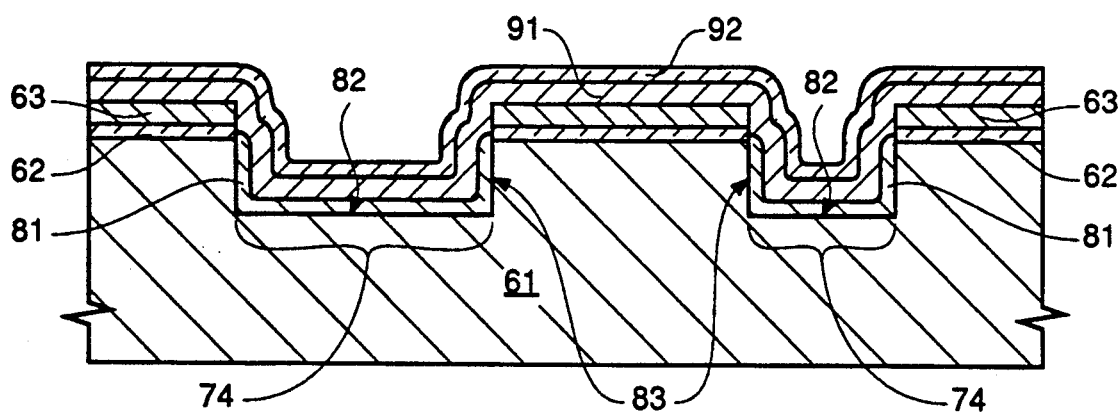
FIG. 9B is a cross-sectional view of the wafer portion of FIG. 8 following.

Referring now to FIG. 9B, an optional conformal silicon dioxide spacer layer 92 is deposited via low pressure chemical vapor deposition on top of said second silicon nitride layer 91.

Figure 10A:
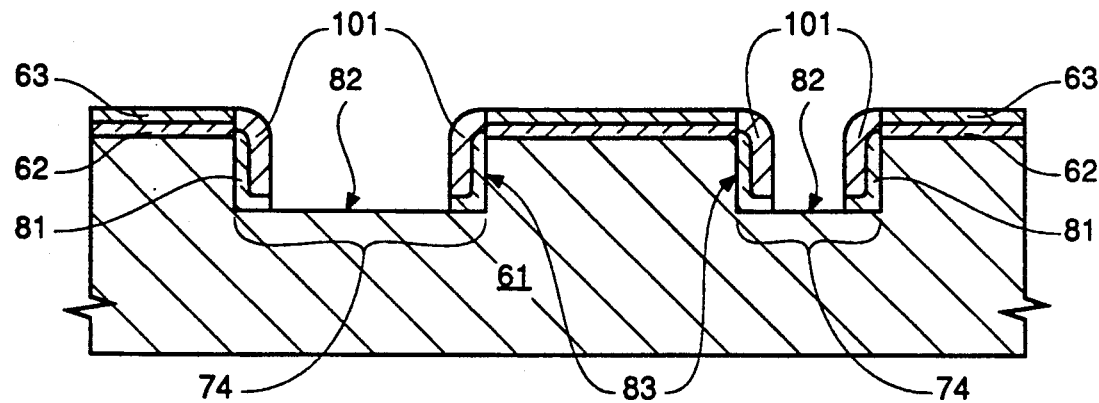
FIG. 10A is a cross-sectional view of the wafer portion of FIG. 9A following a second anisotropic etch.

Referring now to FIG. 10A, the wafer has been subjected to a second anisotropic plasma etch, which has created nitride spacers 101 on the sidewalls of the recessed substrate regions and has cleared the floors 82 of the horizontal portions of the second nitride layer and the second pad oxide layer, while leaving the first nitride layer 63 essentially intact on top of future active areas 72.

Figure 10B:
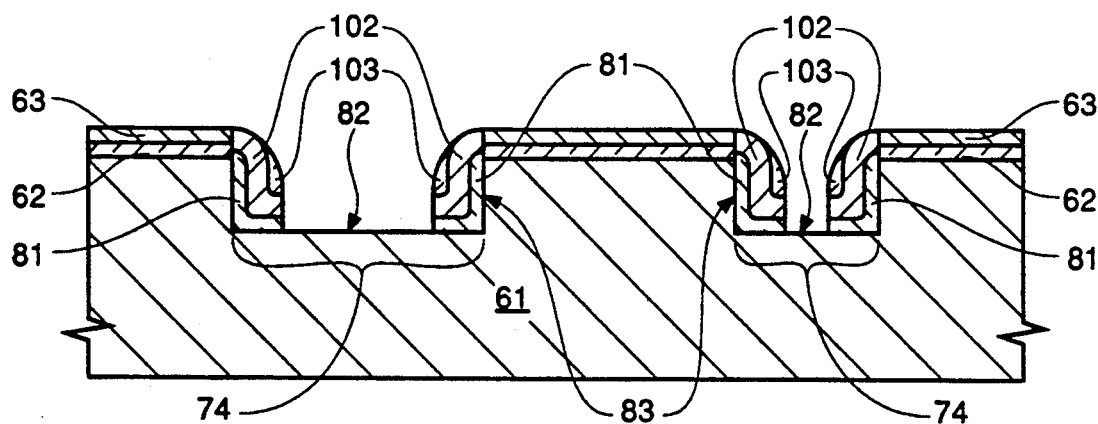
FIG. 10B is a cross-sectional view of the wafer portion of FIG. 9B following a second anisotropic etch.

Referring now to FIG. 10B, the wafer portion of FIG. 9B has been subjected to a second anisotropic plasma etch, which has created "L"-shaped nitride spacers 102 on the sidewalls of the recessed substrate regions, each of said "L"-shaped spacers 102 having an associated silicon dioxide spacer 103, which extends the width of the foot of the "L", said silicon dioxide spacer 103 having been formed from said conformal silicon dioxide spacer layer 92. The second anisotropic plasma etch has also cleared the horizontal portions of the conformal silicon dioxide spacer layer 92, the second nitride layer 91 and the second pad oxide layer 81 within the recessed regions 74 of the substrate 61, while leaving the first nitride layer 63 essentially intact on top of future active areas 72.

Figure 11A:
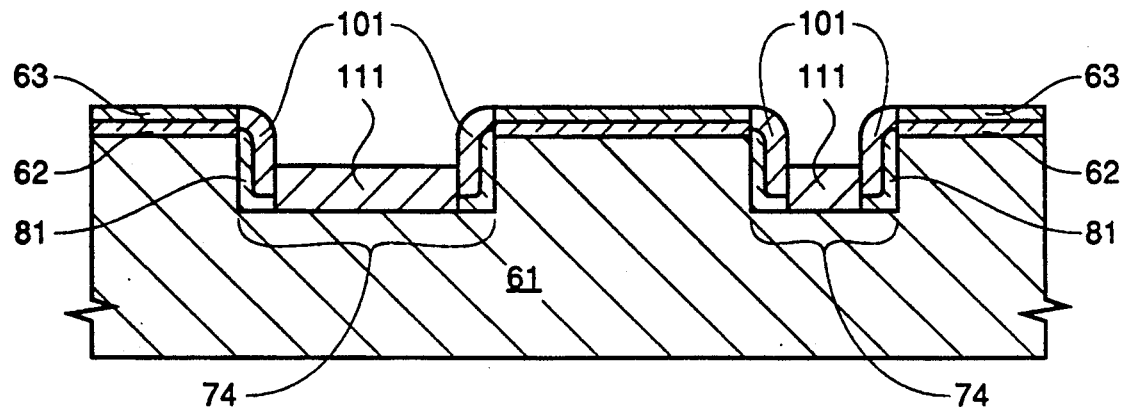
FIG. 11A is a cross-sectional view of the wafer portion of FIG. 10A following epitaxial growth of silicon within the recessed regions.

Referring now to FIG. 11A an epitaxial silicon layer 111 has been grown within the recessed regions 74 of the wafer portion of FIG. 10A to a height that is approximately equal to half the depth of the recessed regions 74.

Figure 11B:
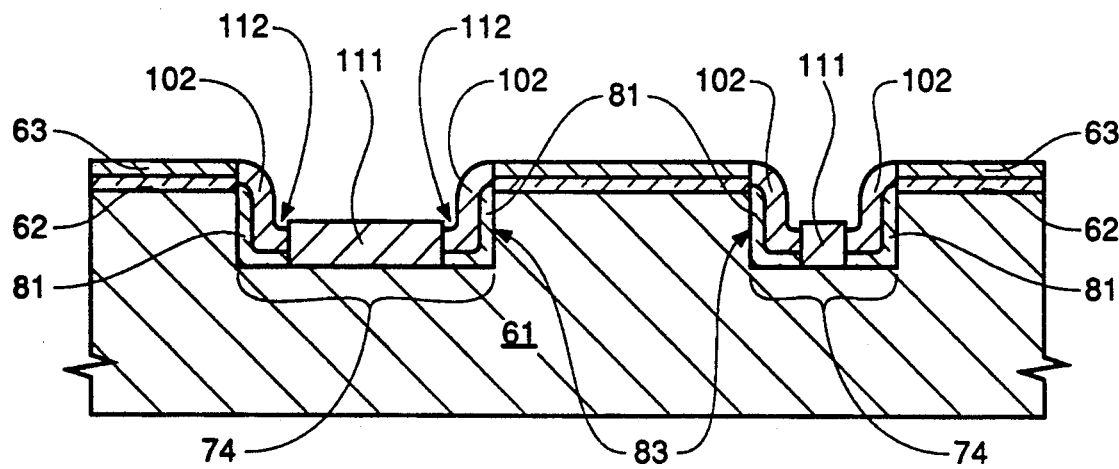
FIG. 11B is a cross-sectional view of the wafer portion of FIG. 10B following epitaxial growth of silicon within the recessed regions and a wet silicon dioxide etch.

Referring now to FIG. 11B, an epitaxial silicon layer 111 has been grown within the recessed regions 74 of the wafer portion of FIG. 10B to a height that is approximately equal to half the depth of the recessed regions 74. Following the epitaxial growth step, the silicon dioxide spacers 103 are removed with a wet silicon dioxide etch, leaving a void 112 around the periphery of the epitaxial silicon layer 111.

Figure 12A:
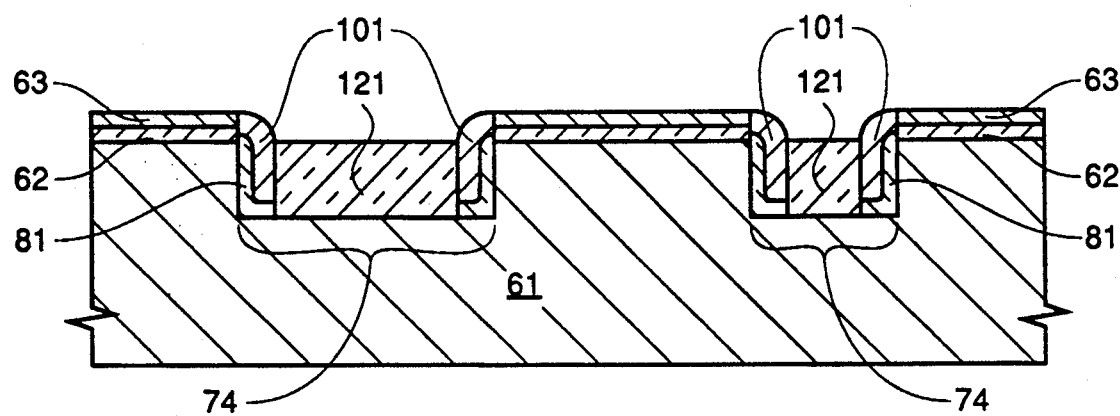
FIG. 12A is a cross-sectional view of the wafer portion of FIG. 11A following a thermal oxidation step which converts the expitaxially-grown silicon layer to a silicon dioxide plug.

Referring now to FIG. 12A, the wafer portion of FIG. 11A has been subjected to a thermal, wet oxidation step which has converted the epitaxially-grown silicon layer 111 to silicon dioxide, thus substantially filling the recessed regions with an oxide plug 121.

Figure 12B:
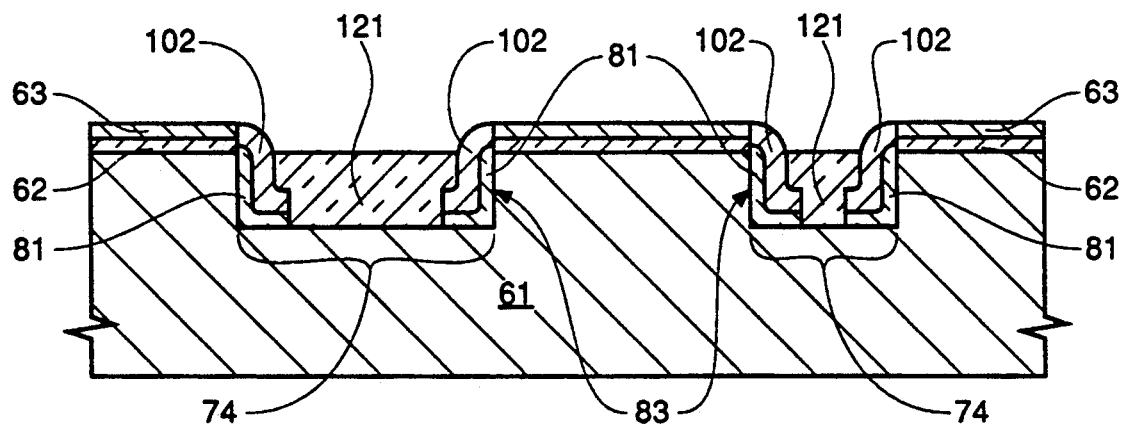
FIG. 12B is a cross-sectional view of the wafer portion of FIG. 11B following a thermal oxidation step which converts the epitaxially-grown silicon layer to a silicon dioxide plug.

Referring now to FIG. 12B, the wafer portion of FIG. 11B has been subjected to a thermal, wet oxidation step which has converted the epitaxially-grown silicon layer 111 to silicon dioxide, thus substantially filling the recessed regions with an oxide plug 121. The void 112 around the periphery of the epitaxial silicon layer 111 provides space in which the swelling silicon dioxide mass can expand, thus reducing the stress against the sidewalls 83 of the recessed regions 74.

Figure 13A:
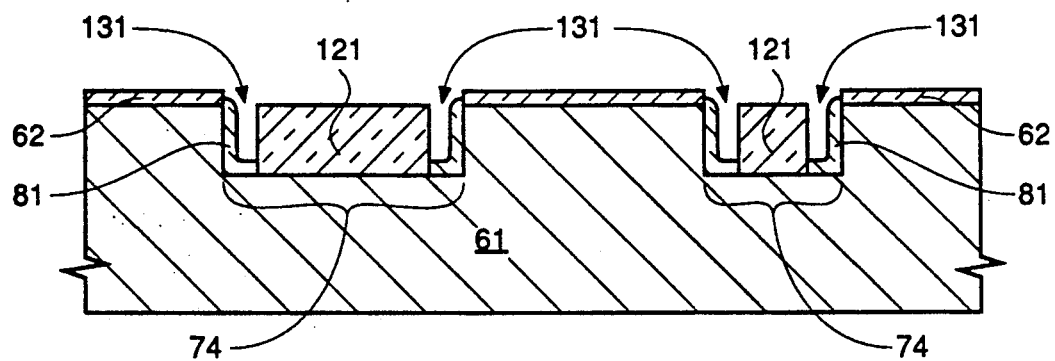
FIGS. 13A and 13B are cross-sectional views of the wafer portion of FIG. 12A (and functionally of 12B, although the physical appearance of the two structures are slightly different) following the removal of remaining silicon nitride and the creation of vertical voids at the edges of the oxidized epitaxially-grown silicon.
Figure 13B:
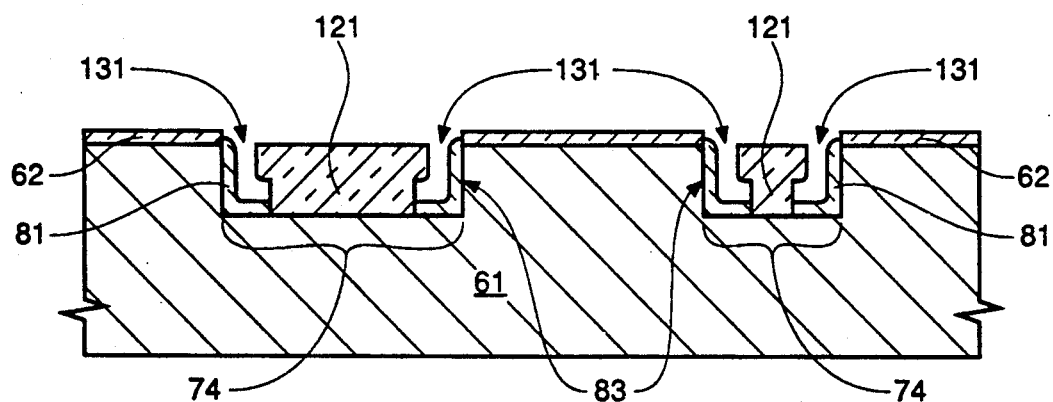

Referring now to FIGS. 13A and 13B, which applies to the follow-up step to both FIGS. 12A and 12B, remaining silicon nitride has been removed with a wet nitride etch, creating voids 131 around the periphery of oxide plugs 121.

Figure 14A:
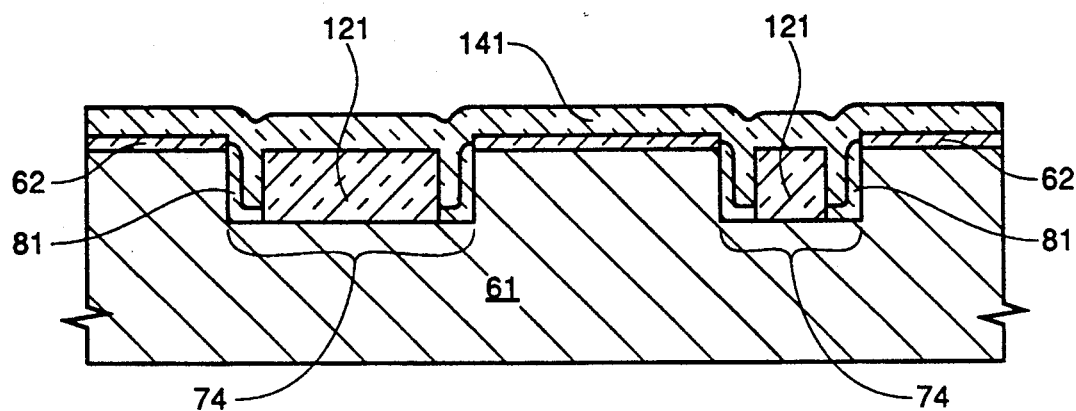
FIG. 14A is a cross-sectional view of the wafer portion of FIG. 14 following a silicon dioxide deposition step which fills the vertical voids left by nitride removal.

Referring now to FIG. 14A, a conformal silicon dioxide filler 141 layer has been conformally deposited over the wafer surface via LPCVD, filling the voids 131 left by nitride removal.

Figure 14B:
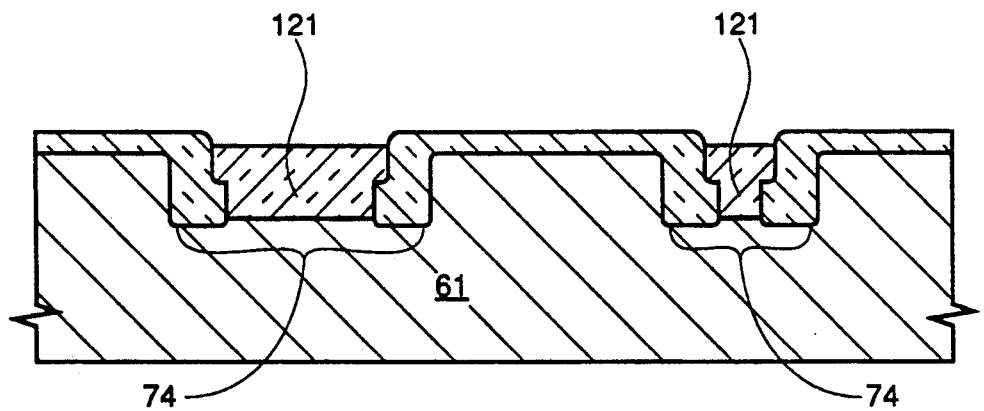
FIG. 14B is a cross-sectional view of the wafer portion of FIG. 14 following further thermal oxidation, which fills the vertical voids left by nitride removal.

Referring now to FIG. 14B, the voids 131 left by nitride removal has been filled by a further thermal oxidation step.

Figure 15:
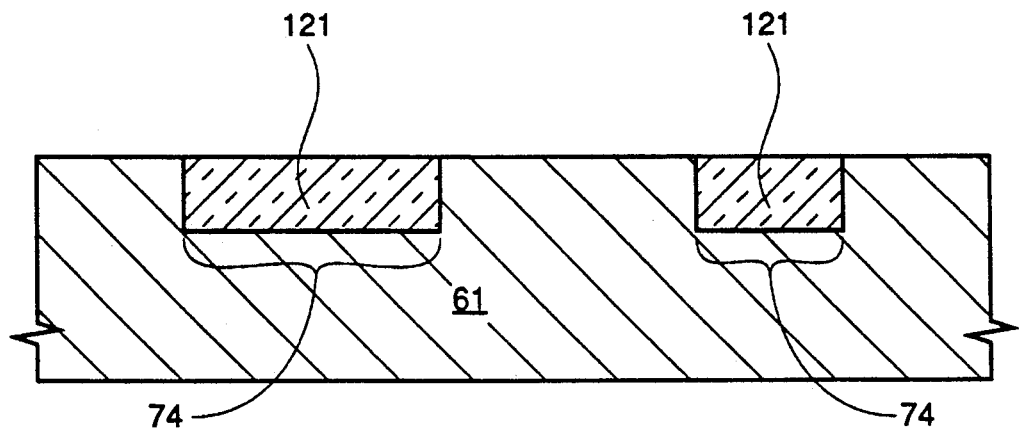

Referring now to FIG. 15, the wafer portions depicted in either FIG. 14A or FIG. 14B have been planarized using any one of a number of techniques, such as a plasma etch-back, resist coat followed by plasma etch-back, or chemical-mechanical planarization.

Although only several embodiments of the process have been disclosed herein, it will be evident from those having ordinary skill in the art of semiconductor manufacture that changes and modifications may be made thereto without departing from the scope and spirit of the invention as claimed.

We claim:

1. A process for creating fully-recessed field isolation regions within the substrate of a substantially planar silicon wafer, said process comprising the following sequence of steps:
    a) creating a first pad oxide layer on the upper surface of the wafer;
    b) depositing a silicon nitride layer on top of the first pad oxide layer;
    c) creating a photoresist mask on the upper surface of the wafer which covers future active areas and exposes future field oxide regions;
    d) performing an anisotropic plasma etch which removes portions of the first pad oxide layer and first nitride layer in unmasked regions of the wafer, and also etches the substrate in said unmasked regions to create recessed substrate regions in the future field oxide regions, said recessed regions having substantially vertical sidewalls and substantially horizontal floors;
    e) removing the photoresist mask;
    f) creating a second pad oxide layer on exposed silicon within the recessed substrate regions;
    g) blanket depositing a second nitride layer;
    h) performing a second anisotropic etch which creates silicon nitride spacers on the substantially vertical sidewalls of said recessed regions, clears the floors of silicon nitride and silicon dioxide, and leaves said first nitride layer on top of the future active areas essentially intact;
    i) growing an epitaxial silicon layer within the recessed regions;
    j) thermally oxidizing the epitaxially-grown silicon layer to create field oxide plugs within the recessed regions;
    k) removing all remaining silicon nitride, thus creating substantially vertical voids around the peripheries of the field oxide plugs; and
    l) filling the voids with silicon dioxide.

2. The process of claim 1, wherein said voids are filled with silicon dioxide via chemical vapor deposition.

3. The process of claim 1, wherein said voids are filled by thermally oxidizing the silicon adjacent said voids.

4. The process of claim 1, which comprises the additional step of planarizing the wafer following the filling of the voids.

5. The process of claim 1, wherein said first and second pad oxide layers are created via thermal oxidation.

6. The process of claim 1, wherein said first and second nitride layers are created via low pressure chemical vapor deposition.

7. The process of claim 1, which comprises the additional step of blanket depositing a conformal silicon dioxide layer over the surface of the wafer immediately following the deposition of said second silicon nitride layer.

8. The process of claim 7, wherein the silicon nitride spacers created by the anisotropic etch of step h) are "L"-shaped, each of said "L"-shaped silicon nitride spacers being associated with a silicon dioxide spacer formed from remnants of said deposited conformal silicon dioxide layer during the anisotropic etch of step h).

9. The process of claim 8, wherein said silicon dioxide spacers are removed following the epitaxial silicon growth step and prior to thermal oxidation of said epitaxially-grown silicon as a stress-reduction technique.

* * * * *